United States Patent
Suzuki et al.

(10) Patent No.: US 9,842,985 B2
(45) Date of Patent: Dec. 12, 2017

(54) MANUFACTURING METHOD FOR PIEZOELECTRIC CERAMICS

(71) Applicant: CANON KABUSHIKI KAISHA, Tokyo (JP)

(72) Inventors: Tatsuya Suzuki, Kawasaki (JP); Masami Tsukamoto, Yokohama (JP); Mikio Shimada, Tokyo (JP); Toshihiro Ifuku, Yokohama (JP); Takanori Matsuda, Chofu (JP); Makoto Kubota, Yokohama (JP); Jumpei Hayashi, Chofu (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 211 days.

(21) Appl. No.: 14/961,382

(22) Filed: Dec. 7, 2015

(65) Prior Publication Data
US 2016/0104833 A1 Apr. 14, 2016

Related U.S. Application Data

(62) Division of application No. 13/989,970, filed as application No. PCT/JP2011/079753 on Dec. 15, 2011, now Pat. No. 9,231,188.

(30) Foreign Application Priority Data

Dec. 22, 2010 (JP) ................. 2010-285742

(51) Int. Cl.
| | |
|---|---|
| *H01L 41/187* | (2006.01) |
| *H01L 41/43* | (2013.01) |
| *B41J 2/16* | (2006.01) |
| *C04B 35/468* | (2006.01) |
| *C04B 35/626* | (2006.01) |
| *C04B 35/64* | (2006.01) |
| *H02N 2/10* | (2006.01) |
| *H02N 2/16* | (2006.01) |
| *B82Y 30/00* | (2011.01) |

(52) U.S. Cl.
CPC ............. *H01L 41/43* (2013.01); *B41J 2/161* (2013.01); *B41J 2/1623* (2013.01); *B41J 2/1632* (2013.01); *B41J 2/1642* (2013.01); *B41J 2/1646* (2013.01); *B82Y 30/00* (2013.01); *C04B 35/4682* (2013.01); *C04B 35/62655* (2013.01); *C04B 35/62695* (2013.01); *C04B 35/64* (2013.01); *H01L 41/1871* (2013.01); *H02N 2/106* (2013.01); *H02N 2/163* (2013.01); *C04B 2235/3201* (2013.01); *C04B 2235/3203* (2013.01); *C04B 2235/3208* (2013.01); *C04B 2235/3213* (2013.01); *C04B 2235/3222* (2013.01); *C04B 2235/3227* (2013.01); *C04B 2235/3232* (2013.01); *C04B 2235/3236* (2013.01); *C04B 2235/3244* (2013.01); *C04B 2235/3262* (2013.01); *C04B 2235/3267* (2013.01); *C04B 2235/3287* (2013.01); *C04B 2235/3293* (2013.01); *C04B 2235/3298* (2013.01); *C04B 2235/3418* (2013.01); *C04B 2235/441* (2013.01); *C04B 2235/442* (2013.01); *C04B 2235/443* (2013.01); *C04B 2235/449* (2013.01); *C04B 2235/5445* (2013.01); *C04B 2235/5454* (2013.01); *C04B 2235/6562* (2013.01); *C04B 2235/6567* (2013.01); *C04B 2235/761* (2013.01); *C04B 2235/85* (2013.01)

(58) Field of Classification Search
CPC .......... C04B 35/4682; C04B 35/62695; C04B 35/64; C04B 2235/3236; C04B 2235/3232; C04B 2235/5454; H01L 41/43; H01L 41/1817
See application file for complete search history.

(56) References Cited

U.S. PATENT DOCUMENTS

| | | | |
|---|---|---|---|
| 6,399,529 B1 | 6/2002 | Yamaguchi et al. | |
| 6,617,274 B2 | 9/2003 | Yamaguchi et al. | |
| 7,525,239 B2 | 4/2009 | Aoki et al. | |
| 7,646,140 B2 | 1/2010 | Aoki et al. | |
| 7,944,126 B2 | 5/2011 | Tanaka et al. | |
| 8,034,250 B2 | 10/2011 | Hayashi et al. | |
| 8,063,973 B2 | 11/2011 | Niwamae | |
| 2002/0151430 A1 | 10/2002 | Yamaguchi et al. | |
| 2008/0145292 A1 | 6/2008 | Shirakawa et al. | |
| 2011/0128327 A1 | 6/2011 | Kubota et al. | |
| 2011/0193451 A1 | 8/2011 | Watanabe et al. | |
| 2013/0200750 A1 | 8/2013 | Watanabe et al. | |

FOREIGN PATENT DOCUMENTS

| | | |
|---|---|---|
| CN | 101048345 A | 10/2007 |
| CN | 101834269 A | 9/2010 |

(Continued)

OTHER PUBLICATIONS

Shih-Chun Lu et al., "Effect of Microstructure on Dielectric and Fatigue Strengths of BaTiO3," 30(12) J. Eur. Ceram. Soc. 2569-2576 (Sep. 2010) (XP027107077).

(Continued)

*Primary Examiner* — Carol M Koslow
(74) *Attorney, Agent, or Firm* — Fitzpatrick, Cella, Harper & Scinto

(57) ABSTRACT

Provided are a barium titanate-based piezoelectric ceramics having satisfactory piezoelectric performance and a satisfactory mechanical quality factor ($Q_m$), and a piezoelectric element using the same. Specifically provided are a piezoelectric ceramics, including: crystal particles; and a grain boundary between the crystal particles, in which the crystal particles each include barium titanate having a perovskite-type structure and manganese at 0.04% by mass or more and 0.20% by mass or less in terms of a metal with respect to the barium titanate, and the grain boundary includes at least one compound selected from the group consisting of $Ba_4Ti_{12}O_{27}$ and $Ba_6Ti_{17}O_{40}$, and a piezoelectric element using the same.

2 Claims, 8 Drawing Sheets

(56) References Cited

FOREIGN PATENT DOCUMENTS

| | | |
|---|---|---|
| DE | 1671076 B2 | 7/1971 |
| EP | 2328193 A2 | 6/2011 |
| JP | 2001-172077 A | 6/2001 |
| JP | 2008-098627 A | 4/2008 |
| JP | 2008-150247 A | 7/2008 |
| JP | 2009-010736 A | 1/2009 |
| JP | 2010-120835 A | 6/2010 |

OTHER PUBLICATIONS

X. Xu et al., "Effects of Ba6Ti17O40 on the Dielectric Properties of Nb-Doped BaTiO3 Ceramics," 89(8) J. Maer. Ceram. Soc. 2496-2501 (Aug. 2006).

Office Action in Chinese Application No. 201180060904.8 (dated Feb. 27, 2014).

Jian-quan Qi et al., "The Behavior of Grain Boundary Defects and Impurities Related to PTCR Effects in Semiconducting BaTiO3-based Ceramics," 22(2) Piezoelectrics & Acoustooptics 114-117 (Apr. 2000).

Office Action in Korean Application No. 10-2013-7018573 (Sep. 21, 2014).

R. K. Sharma et al., "Solubility of TiO2 in BaTiO3," 64(8) J. Am. Ceram. Soc. 448-451 (Aug. 1981).

Shih-Chun Lu et al., "Effect of Microstructure on Dielectric and Fatigue Strengths of BaTiO3," 30(12) J. Europ. Ceram. Soc. 2569-2576 (Sep. 2010).

Hilkat Erkalfa et al., "The Effect of TiCl3 on the Microstructure of Donor-Doped Boron-Added Ti-Excess BaTiO3," 26(14) J. Europ. Ceram. Soc. 2909-2913 (Oct. 2006).

Notification of Reasons for Refusal in Japanese Application No. 2010-285742 (dated Feb. 10, 2015).

International Search Report with Written Opinion in International Application No. PCT/JP2011/079753 (dated Jun. 27, 2012).

International Preliminary Report on Patentability in International Application No. PCT/JP2011/079753 (dated Jul. 4, 2013).

Shimizu et al., U.S. Appl. No. 14/989,958, filed Jan. 7, 2016.

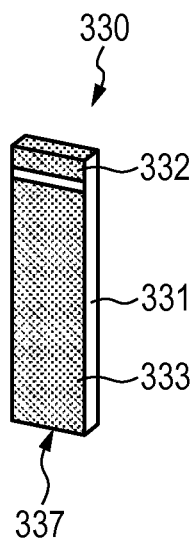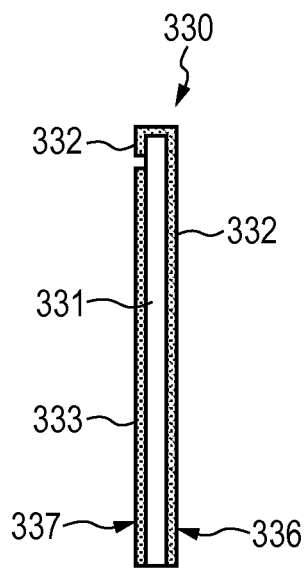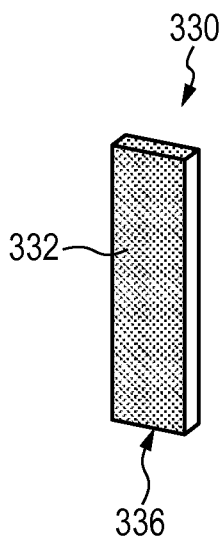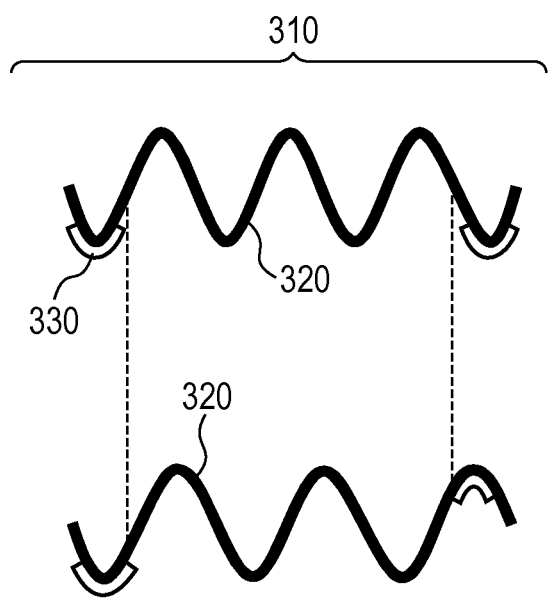

MANUFACTURING METHOD FOR PIEZOELECTRIC CERAMICS

CROSS-REFERENCE TO RELATED APPLICATIONS

This application is a divisional application of application Ser. No. 13/989,970, which was the National Stage of International Application No. PCT/JP2011/079753, filed Dec. 15, 2011, which claims the benefit of Japanese Patent Application No. 2010-285742, filed Dec. 22, 2010. All of these prior applications are incorporated herein by reference in their entirety.

TECHNICAL FIELD

The present invention relates to a piezoelectric ceramics, a manufacturing method therefor, a piezoelectric element, a liquid discharge head, an ultrasonic motor, and a dust removal device. Specifically, the present invention relates to a barium titanate-based piezoelectric ceramics provided with satisfactory piezoelectric performance and a satisfactory mechanical quality factor ($Q_m$) by controlling composition of a crystal grain boundary and a crystal structure.

BACKGROUND ART

A commonly used piezoelectric ceramics is an $ABO_3$-type perovskite oxide such as lead titanate zirconate (hereinafter, referred to as "PZT").

However, it is considered that PZT, which contains lead as an A-site element, may cause environmental problems. Therefore, a piezoelectric ceramics with a lead-free perovskite-type oxide has been desired.

Barium titanate is known as a material for a lead-free perovskite-type piezoelectric ceramics. Patent Literature 1 discloses barium titanate prepared by a resistance heating/two-step sintering technique. The patent literature describes that a ceramics with excellent piezoelectric property can be obtained when nano-sized barium titanate powder is sintered by the two-step sintering technique. However, the ceramics obtained by the two-step sintering technique is not suitable for use in a resonance device because it has a small mechanical quality factor and low high-temperature durability.

Further, Patent Literature 2 discloses a ceramics obtained by replacing part of a barium site in barium titanate with calcium and further adding manganese, iron, or copper. The patent literature describes that the ceramics has an excellent mechanical quality factor by virtue of manganese, iron, or copper. However, an increase in calcium content shifts the temperature of crystal phase transition to about −50° C., resulting in a remarkable decrease in piezoelectric performance.

Further, it is well known in the art that an increase in amount of manganese added leads to precipitation of manganese oxide $(MnO)_x$ outside crystal particles of barium titanate. The manganese oxide lacks properties of a dielectric substance, and hence causes a decrease in piezoelectric performance of a ceramics. Further, the manganese oxide causes a decrease in mechanical quality factor because the valence of manganese is unstable.

In other words, a barium titanate-based piezoelectric ceramics is expected to have both of satisfactory piezoelectric performance and a high mechanical quality factor.

CITATION LIST

Patent Literature

PTL 1: Japanese Patent Application Laid-Open No. 2008-150247
PTL 2: Japanese Patent Application Laid-Open No. 2010-120835

SUMMARY OF INVENTION

Technical Problem

The present invention has been made to cope with the above-mentioned problems. An object of the present invention is to provide a piezoelectric ceramics provided with satisfactory piezoelectric performance and a satisfactory mechanical quality factor ($Q_m$) by controlling composition of a crystal grain boundary and a crystal structure, and a manufacturing method therefor.

Another object of the present invention is to provide a piezoelectric element, a liquid discharge head, an ultrasonic motor, and a dust removal device each using the piezoelectric ceramics.

Solution to Problem

A piezoelectric ceramics for solving the above-mentioned problems includes: crystal particles; and a grain boundary between the crystal particles, in which, the crystal particles each include barium titanate having a perovskite-type structure and manganese at 0.04% by mass or more and 0.20% by mass or less in terms of a metal with respect to the barium titanate, and the grain boundary includes at least one compound selected from the group consisting of $Ba_4Ti_{12}O_{27}$ and $Ba_6Ti_{17}O_{40}$.

A manufacturing method for a piezoelectric ceramics for solving the above-mentioned problems includes at least: producing granulating powder by adding a binder to barium titanate particles each including manganese at 0.04% by mass or more and 0.20% by mass or less in terms of a metal; and sintering a mixture prepared by adding at least one compound selected from the group consisting of $Ba_4Ti_{12}O_{27}$ particles and $Ba_6Ti_{17}O_{40}$ particles to the granulating powder.

Further, a manufacturing method for a piezoelectric ceramics for solving the above-mentioned problems includes at least: producing granulating powder by adding a binder to barium titanate particles each including manganese at 0.04% by mass or more and 0.20% by mass or less in terms of a metal; and sintering a mixture prepared by adding titanium oxide particles each having an average particle diameter of 100 nm or less to the granulating powder.

A piezoelectric element for solving the above-mentioned problems includes at least: a first electrode; a piezoelectric ceramics; and a second electrode, in which the piezoelectric ceramics includes the above-mentioned piezoelectric ceramics.

A liquid discharge head for solving the above-mentioned problems is a liquid discharge head, using the above-mentioned piezoelectric element.

An ultrasonic motor for solving the above-mentioned problems is an ultrasonic motor, using the above-mentioned piezoelectric element.

A dust removal device for solving the above-mentioned problems is a dust removal device, using the above-mentioned piezoelectric element.

Advantageous Effects of Invention

According to the present invention, it is possible to provide the piezoelectric ceramics provided with satisfactory piezoelectric performance and a satisfactory mechanical quality factor ($Q_m$) by controlling composition of a crystal grain boundary and a crystal structure, and a manufacturing method therefor. Further, according to the present invention, it is possible to provide the piezoelectric element, the liquid discharge head, and the ultrasonic motor each using the piezoelectric ceramics.

Further features of the present invention will become apparent from the following description of exemplary embodiments with reference to the attached drawings.

BRIEF DESCRIPTION OF DRAWINGS

FIG. 4A is a schematic diagram illustrating the construction of a piezoelectric element of the present invention in each of FIGS. 3A and 3B.

FIG. 4B is a schematic diagram illustrating the construction of the piezoelectric element of the present invention in each of FIGS. 3A and 3B.

FIG. 4C is a schematic diagram illustrating the construction of the piezoelectric element of the present invention in each of FIGS. 3A and 3B.

FIG. 5 is pattern diagram illustrating a vibration principle of a dust removal device of the present invention.

DESCRIPTION OF EMBODIMENTS

Hereinafter, embodiments of the present invention are described.

A piezoelectric ceramics according to the present invention includes: crystal particles; and a grain boundary between the crystal particles, in which, the crystal particles each include barium titanate having a perovskite-type structure and manganese at 0.04% by mass or more and 0.20% by mass or less in terms of a metal with respect to the barium titanate, and the grain boundary includes at least one compound selected from the group consisting of $Ba_4Ti_{12}O_{27}$ and $Ba_6Ti_{17}O_{40}$.

The term "ceramics" used herein refers to an aggregate (also referred to as bulk) of crystal particles sintered by thermal treatment, or the so-called polycrystal, in which the main component thereof is a metal oxide. The term also includes one processed after sintering. However, the term does not include any powder or powder-dispersed slurry.

The barium titanate having a perovskite-type structure is $BaTiO_3$. In addition, here, the barium titanate may include other property-regulating components and impurities due to production as well as manganese.

In the piezoelectric ceramics in the present invention, the compound having a non-perovskite structure is present in the grain boundary of crystal particles outside the crystal particles of the barium titanate having a perovskite-type structure. The compound having a non-perovskite structure is at least one compound selected from $Ba_4Ti_{12}O_{27}$ and $Ba_6Ti_{17}O_{40}$.

Further, in this description, at least one compound selected from $Ba_4Ti_{12}O_{27}$ and $Ba_6Ti_{17}O_{40}$ present outside the crystal particles is referred to as "sub-particles."

The $Ba_4Ti_{12}O_{27}$ belongs to a space group C2/m and has properties of a dielectric substance. In addition, the $Ba_6Ti_{17}O_{40}$ belongs to a space group A2/a and has properties of a dielectric substance.

The term "grain boundary" used herein refers to an interface between crystal particles (the interface includes cases where the crystal particles are in contact with each other linearly and intermittently). Further, in the following description, among the "grain boundaries," a plane or a line on which two crystal particles come into contact with each other may be referred to as "boundary." In addition, in the following description, among the "grain boundaries," a site at which three or more crystal particles cross with each other at one point or on a line may be referred to as "triple point" (three needle crystal particles may cross with each other with a "line" in the boundary).

Figure 6:
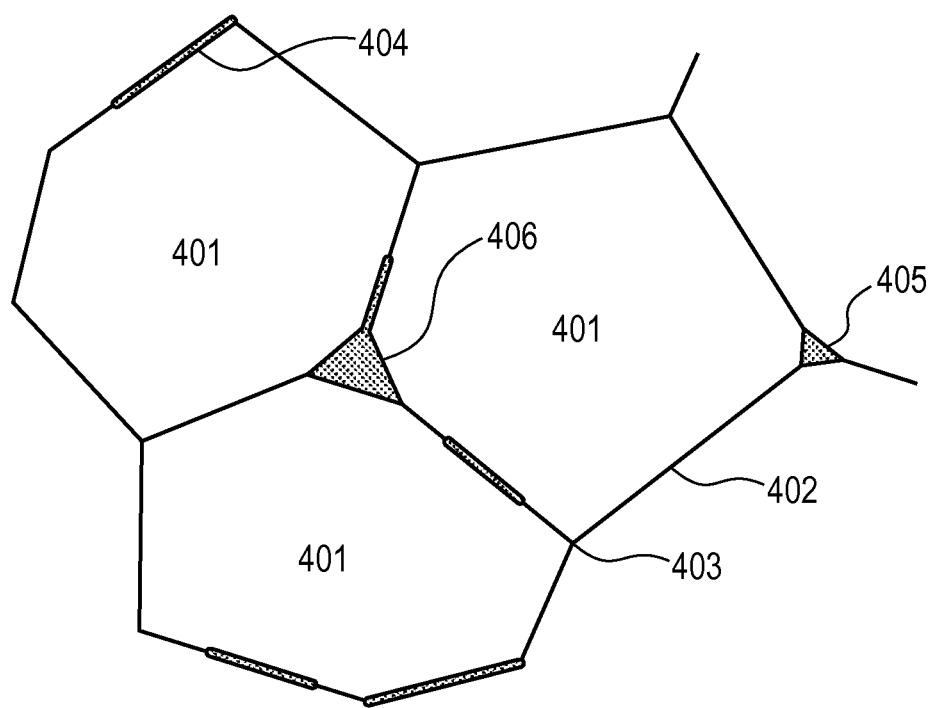
FIG. 6 is a conceptual diagram illustrating an embodiment of a piezoelectric ceramics of the present invention.

FIG. 6 is a conceptual diagram illustrating an embodiment of the piezoelectric ceramics of the present invention and schematically represents a relationship among crystal particles, grain boundaries, and sub-particles. Barium titanate crystal particles are represented by 401. The crystal particles are in contact with each other via at least one of a boundary and a triple point. The boundary between the crystal particles is represented by 402 and the triple point is represented by 403. A sub-particle present in the boundary between the crystal particles is represented by 404. In the piezoelectric ceramics of the present invention, at least one compound selected from sub-particles, $Ba_4Ti_{12}O_{27}$ and $Ba_6Ti_{17}O_{40}$, is present in the grain boundary (boundary or triple point) of the crystal particles. In the figure, at least one sub-particle of $Ba_4Ti_{12}O_{27}$ and $Ba_6Ti_{17}O_{40}$ present at the triple point is represented by 405 or 406.

As one of techniques for easily distinguishing between the crystal particle and the sub-particle, there is known a method using a scanning electron microscope (SEM). In other words, the method utilizes a fact that observation of the surface of the piezoelectric ceramics by an SEM secondary electron image allows a user to observe the crystal particle and the sub-particle with different contrasts.

Figure 7A:
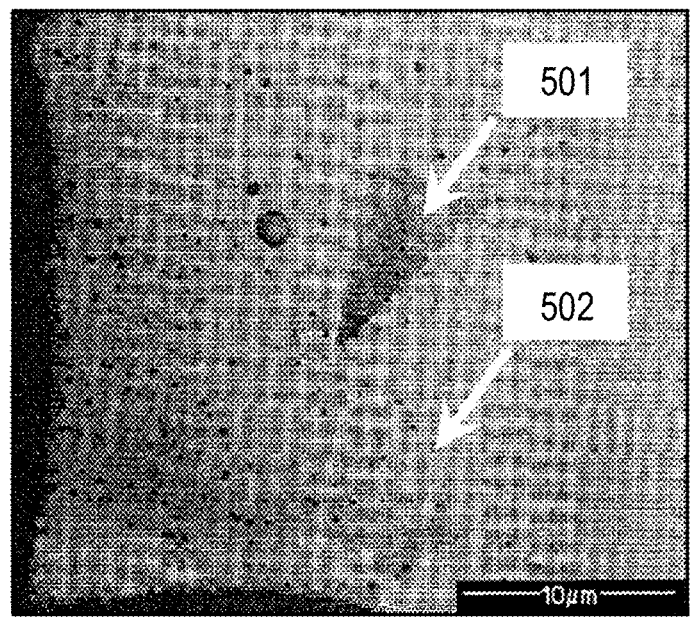
FIG. 7A is an SEM secondary electron image of a surface of a piezoelectric ceramics of the present invention.
Figure 7B:
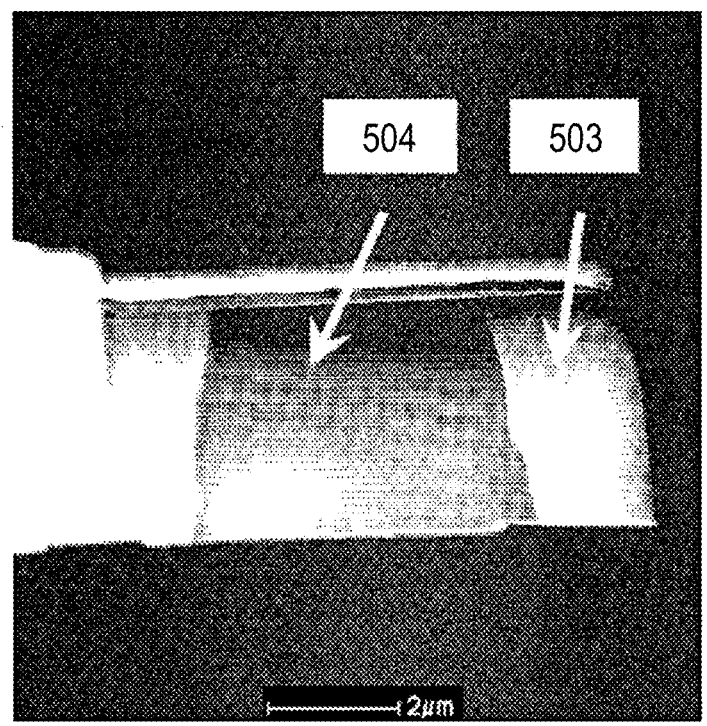
FIG. 7B is a TEM observation image of the piezoelectric ceramics of the present invention.

FIG. 7A is an SEM secondary electron image obtained by observing the surface of the piezoelectric ceramics of the present invention. The image reveals that a sub-particle present at a triple point 502 and a crystal particle 501 can be observed with different contrasts. In addition, FIG. 7B is an image of part of the piezoelectric ceramics, which includes the sub-particle, obtained by transmission electron microscopy (TEM). It is found that the TEM observation can distinguish the part of a sub-particle 504 and the part of a crystal particle 503.

A barium (Ba) site of the barium titanate ($BaTiO_3$) may be partially replaced with another bivalent metal or a pseudo-bivalent metal. Examples of the bivalent metal, with which the Ba site can be replaced, include Ca and Sr. Examples of the pseudo-bivalent metal, with which the Ba site can be replaced, include ($Bi_{0.5}Na_{0.5}$), ($Bi_{0.5}K_{0.5}$), ($Bi_{0.5}Li_{0.5}$), ($La_{0.5}Na_{0.5}$), ($La_{0.5}K_{0.5}$), and ($La_{0.5}Li_{0.5}$). A replacement ratio in the case of partially replacing the Ba site with another bivalent metal or a pseudo-bivalent metal is 20 atm % or less, preferably 10 atm % or less. When the replacement ratio exceeds 20 atm %, high piezoelectric property inherent to barium titanate may not be sufficiently obtained.

A titanium (Ti) site of the barium titanate ($BaTiO_3$) may be partially replaced with another tetravalent metal or a pseudo-tetravalent metal. Examples of the tetravalent metal, with which the Ti site can be replaced, include Zr, Hf, Si, Sn, and Ge. Examples of the pseudo-tetravalent metal, with which the Ti site can be replaced, include a combination of a divalent metal and a pentavalent metal ($M^{2+}_{1/3}M^{5+}_{2/3}$), a combination of a trivalent metal and a pentavalent metal ($M^{3+}_{1/2}M^{5+}_{1/2}$), and a combination of a trivalent metal and a hexavalent metal ($M^{3+}_{2/3}M^{6+}_{1/3}$).

In the piezoelectric ceramics of the present invention, a crystal particle contains manganese in the range of 0.04% by mass or more and 0.20% by mass or less, preferably 0.05 by mass or more and 0.17% by mass or less in terms of a metal with respect to barium titanate. When a piezoelectric ceramics containing barium titanate as a main component contains a manganese component in the above-mentioned range, the piezoelectric ceramics can be provided with improved insulating property and an improved mechanical quality factor ($Q_m$). When the content of manganese is less than 0.04% by mass with respect to the barium titanate, the mechanical quality factor of the piezoelectric ceramics cannot be sufficiently enhanced. In contrast, when the content of manganese is more than 0.20% by mass, hexagonal barium titanate or an impurity phase, which has less piezoelectric performance, may coexist. Thus, the piezoelectric performance of the entire piezoelectric ceramics may become insufficient.

$Ba_4Ti_{12}O_{27}$ or $Ba_6Ti_{17}O_{40}$, which is a compound constructing a sub-particle included in the grain boundary, can be specified, for example, by subjecting the compound to a comparison between a diffraction image obtained by a selected-area diffraction method using a transmission electron microscope (TEM) and data in a known literature.

The selected-area diffraction method is a method of observing a diffraction pattern of only a specific area in an enlarged image observed with a transmission electron microscope (TEM). The use of the method allows the observation of only the diffraction pattern generated from the above-mentioned compound.

The sub-particle can fill a void that may be formed in the grain boundary between crystal particles. When the void is filled with the sub-particle formed of at least one of the dielectric substances, $Ba_4Ti_{12}O_{27}$ and $Ba_6Ti_{17}O_{40}$, the dielectric constant of the piezoelectric ceramics can be enhanced compared with that in a state in which the void exists. In other words, the filling of the void with the sub-particle can enhance the piezoelectric performance of the piezoelectric ceramics.

In the piezoelectric ceramics of the present invention, it is desired that the ratio of the at least one compound selected from the group consisting of $Ba_4Ti_{12}O_{27}$ and $Ba_6Ti_{17}O_{40}$ in the grain boundary when observed on one of a surface and a cross-section of the piezoelectric ceramics be 0.05% by area or more and 2% by area or less, preferably 0.1% by area or more and 0.5% by area or less with respect to the total area of one of the surface and the cross-section of the piezoelectric ceramics.

When the content of $Ba_4Ti_{12}O_{27}$ or $Ba_6Ti_{17}O_{40}$ in the grain boundary, or the ratio of the sub-particle in the whole piezoelectric ceramics is less than 0.05% by area, the precipitation of manganese oxide in the grain boundary may not be completely prevented. Thus, high piezoelectric performance inherent to barium titanate may not be sufficiently obtained. When the ratio of the sub-particle in the grain boundary is more than 2% by area, a sub-particle which has no piezoelectric property is excessively precipitated in the grain boundary. Thus, high piezoelectric performance inherent to barium titanate may not be sufficiently obtained.

Further, the ratio of the sub-particle included in the grain boundary with respect to the piezoelectric ceramics can be calculated by the above-mentioned method using a scanning electron microscope. The surface or cross-section of the piezoelectric ceramics containing manganese is observed using a reflected electron image of the scanning electron microscope. In the above-mentioned observation method, the sub-particle and the crystal particle of the piezoelectric ceramics are observed with different contrasts. Thus, the sub-particle is distinguished from the crystal particle of the piezoelectric ceramics, and the ratio of the sub-particle is calculated by measuring the area ratio of both the particles.

In the piezoelectric ceramics of the present invention, it is preferred that the grain boundary includes: one of $Ba_4Ti_{12}O_{27}$ and $Ba_6Ti_{17}O_{40}$; and the $Ba_4Ti_{12}O_{27}$ and the $Ba_6Ti_{17}O_{40}$ both include manganese.

In general, the addition of manganese to a piezoelectric ceramics does not always lead to the presence of all the manganese added in the inside of crystal particles. When manganese is added to a conventional piezoelectric ceramics, the manganese added is present as manganese oxide ($MnO_x$) in the grain boundary.

In the piezoelectric ceramics that contains the manganese oxide in the grain boundary, the manganese oxide, which does not have properties of a dielectric substance, causes a decrease in insulating property of the piezoelectric ceramics, resulting in a decrease in piezoelectric performance as well. Further, the manganese oxide is present in the grain boundary, or outside the crystal particles, causing the valence of manganese unstable. Therefore, the manganese oxide reduces a mechanical quality factor of the piezoelectric ceramics.

In contrast, in the piezoelectric ceramics of the present invention, a sub-particle, or at least one compound selected from $Ba_4Ti_{12}O_{27}$ and $Ba_6Ti_{17}O_{40}$ is present in the grain boundary.

As $Ba_4Ti_{12}O_{27}$ and $Ba_6Ti_{17}O_{40}$ are dielectric substances, the presence of such compounds in the grain boundary do not cause a decrease in insulating property of the piezoelectric ceramics. Further, a state in which no manganese oxide is present in the grain boundary can be established by incorporating manganese, which has been present in the grain boundary as manganese oxide, into the sub-particle. As a result, the decreases in piezoelectric performance and in mechanical quality factor due to manganese oxide described above can be prevented.

Therefore, in the piezoelectric ceramics of the present invention, $Ba_4Ti_{12}O_{27}$ or $Ba_6Ti_{17}O_{40}$ included in the grain boundary preferably contains manganese.

In the piezoelectric ceramics of the present invention, it is desired that the content of manganese in at least one compound selected from the group consisting of $Ba_4Ti_{12}O_{27}$ and $Ba_6Ti_{17}O_{40}$ in the grain boundary be 0.6% by mass or more and 2.8% by mass or less, preferably 1.0% by mass or more and 2.0% by mass or less in terms of a metal with respect to the at least one compound selected from the group consisting of $Ba_4Ti_{12}O_{27}$ and $Ba_6Ti_{17}O_{40}$.

When the content of manganese is less than 0.6% by mass, or the amount of manganese dissolved as a solid solution in at least one of $Ba_4Ti_{12}O_{27}$ and $Ba_6Ti_{17}O_{40}$ is small, manganese, which is not dissolved as a solid solution in the crystal particle, may cause precipitation of a compound containing manganese as a main component, such as manganese oxide, in the grain boundary.

Further, when the content of manganese is more than 2.8% by mass, or the amount of manganese dissolved as a solid solution in at least one of $Ba_4Ti_{12}O_{27}$ and $Ba_6Ti_{17}O_{40}$ is large, the amount of the manganese dissolved as a solid solution in the crystal particle decreases. Thus, the piezoelectric ceramics may not be sufficiently provided with sufficient mechanical quality factor.

The content of the manganese may be specified, for example, from an analytical result obtained by energy dispersive spectroscopy on an area where a crystal structure is defined on any of $Ba_4Ti_{12}O_{27}$ and $Ba_6Ti_{17}O_{40}$ when the grain boundary is observed by the selected-area diffraction method.

In the piezoelectric ceramics of the present invention, it is preferred that the grain boundary includes $Ba_4Ti_{12}O_{27}$ and $Ba_6Ti_{17}O_{40}$; and the $Ba_4Ti_{12}O_{27}$ and the $Ba_6Ti_{17}O_{40}$ each include manganese.

When the grain boundary is occupied by $Ba_4Ti_{12}O_{27}$ and $Ba_6Ti_{17}O_{40}$, the dielectric constant of the whole piezoelectric ceramics is increased, leading to an increase in piezoelectric performance. In addition, manganese dissolved as a solid solution in the crystal particle of $Ba_4Ti_{12}O_{27}$ and $Ba_6Ti_{17}O_{40}$ can be prevented from being precipitated in the grain boundary or void between the crystal particles as a compound containing Mn as a main component such as manganese oxide (MnO).

In the piezoelectric ceramics of the present invention, it is preferred that the content ratio of manganese in the $Ba_4Ti_{12}O_{27}$ be larger than the content ratio of manganese in the $Ba_6Ti_{17}O_{40}$. The content ratio of manganese in each of $Ba_4Ti_{12}O_{27}$ and $Ba_6Ti_{17}O_{40}$ can be evaluated, for example, by a combination of energy dispersive spectroscopy with a crystal structure determined by the above-mentioned selected-area diffraction method.

A large content of manganese in $Ba_4Ti_{12}O_{27}$ leads to increases in insulating property and sintering density.

The term "particle diameter" of the piezoelectric ceramics used herein refers to the so-called "projected area diameter" in microscopic observation, and refers to the diameter of a perfect circle having an area equal to the projected area of a crystal particle. In the present invention, a measuring method for the particle diameter is not particularly limited. For example, the particle diameter may be determined by image processing on a photographic image of the surface of the piezoelectric ceramics captured by a polarizing microscope or scanning electron microscope. An exemplary magnification in determining the particle diameter of the crystal particle is about 5 to 5,000 times. One of a light microscope and an electron microscope may be used properly depending on the magnification. The particle diameter may also be determined from an image of a ground surface or a cross-section of the ceramics instead of the surface thereof.

Next, a manufacturing method for a piezoelectric ceramics of the present invention is described.

A first aspect of the manufacturing method for a piezoelectric ceramics according to the present invention includes at least: producing granulating powder by adding a binder to barium titanate particles each including manganese at 0.04% by mass or more and 0.20% by mass or less in terms of a metal; and sintering a mixture prepared by adding at least one compound selected from the group consisting of $Ba_4Ti_{12}O_{27}$ particles and $Ba_6Ti_{17}O_{40}$ particles to the granulating powder.

The barium titanate particles each including manganese may include other property-regulating components and impurities due to synthesis as well as barium titanate and manganese. Examples of the impurities include components derived from metals such as aluminum, calcium, niobium, iron, and lead, glass components, and hydrocarbon-based organic components. The content of the impurities is preferably 5% by mass or less, more preferably 1% by mass or less.

The average particle diameter of the barium titanate particles each including manganese as primary particles is not particularly limited. However, in order to obtain a high-density homogeneous piezoelectric ceramics, it is desired that the average particle diameter of the primary particles be 5 nm or more and 300 nm or less, preferably 50 nm or more and 150 nm or less. The density of the ceramics after sintering may become insufficient when the average particle diameter of the primary particles is too small or too large. Here, the term "primary particle" refers to the minimum unit of a substance which can be clearly distinguished from others among particles constructing powder. The primary particles may aggregate to form larger secondary particles. The secondary particles may be intentionally formed by a granulation step using a polymeric binder.

A manufacturing method for the barium titanate particles each including manganese and a manufacturing method for granulating powder including adding a binder to the barium titanate particles each including manganese are not particularly limited.

In the case of manganese-attached barium titanate, the attaching may be performed by adding a manganese component to commercially available or synthesized barium titanate particles in a downstream step. An addition method for the manganese component is not limited. However, it is desired that the manganese component be uniformly attached to the surface of barium titanate. In the viewpoint, the most preferred addition method is a spray-drying method. The spray-drying method is also preferred from the viewpoints that the method allows producing granulating powder by adding a binder concomitantly with the attaching of the manganese component and that the method allows making the particle diameter more uniform.

In the case of barium titanate in which manganese is dissolved as a solid solution, a barium titanate precursor in which a manganese component is previously incorporated may be crystallized. For example, an equimolar mixture of a barium compound and a titanium compound is prepared, and a desired amount of a manganese component is then added to the mixture. Subsequently, the mixture is calcined at about 1,000° C. to obtain barium titanate particles in each of which the manganese component is dissolved as a solid solution.

Also in this case, a manufacturing method for the granulating powder is not particularly limited. However, a spray-drying method is preferred from the viewpoint that the method allows making the particle diameter more uniform.

Examples of the binder which may be used in granulation include polyvinyl alcohol (PVA), polyvinyl butyral (PVB), and an acrylic resin. The amount of the binder added is preferably 1% by mass to 10% by mass, more preferably 2% by mass to 5% by mass from the viewpoint of an increase in density of a molded article.

Examples of the barium compound which may be used in the production of the barium titanate particles each including manganese include barium carbonate, barium oxalate, barium oxide, barium acetate, barium nitrate, barium aluminate, and various barium alkoxides.

Examples of the titanium compound which may be used for the barium titanate particles each including manganese include titanium oxide.

Examples of the manganese component which may be used for the barium titanate particles each including manganese include manganese compounds such as manganese oxide, manganese dioxide, manganese acetate, and manganese carbonate.

In the piezoelectric ceramics obtained by sintering a mixture prepared by adding at least one of $Ba_4Ti_{12}O_{27}$ particles and $Ba_6Ti_{17}O_{40}$ particles to the granulating powder, at least one of the $Ba_4Ti_{12}O_{27}$ particles and the $Ba_6Ti_{17}O_{40}$ particles added is precipitated in the grain boundary. By the above-mentioned mechanism, such piezoelectric ceramics is capable of keeping Mn in the crystal particles to satisfy both the piezoelectric performance and the mechanical quality factor. The addition amount of each of the $Ba_4Ti_{12}O_{27}$ particles and the $Ba_6Ti_{17}O_{40}$ particles is preferably 0.02% by mass or more and 1.5% by mass or less. In other words, the manufacturing method A allows the $Ba_4Ti_{12}O_{27}$ particles or the $Ba_6Ti_{17}O_{40}$ particles to be precipitated in the grain boundary without fail.

The mixed barium titanate particles are molded into a desired shape and then sintered to give a ceramics.

A sintering method for the ceramics in the above-mentioned manufacturing method is not limited. Examples of the sintering method include electric furnace sintering, energization heating, microwave sintering, millimeterwave sintering, and hot isostatic press (HIP).

The sintering temperature of the ceramics in the above-mentioned manufacturing method is not limited, but is desirably a temperature that allows the sufficient crystal growth of barium titanate. Thus, the sintering temperature is preferably 1,000° C. or more and 1,450° C. or less, more preferably 1,300° C. or more and 1,400° C. or less. The barium titanate ceramics sintered in the above-mentioned temperature range shows satisfactory piezoelectric performance.

In order to keep constant the properties of the piezoelectric ceramics obtained by sintering with high reproducibility, it is preferred that the sintering be performed for about 1 hour or more and 12 hours or less while keeping the sintering temperature constant in the above-mentioned range.

A second aspect of the manufacturing method for a piezoelectric ceramics according to the present invention includes at least: producing granulating powder by adding a binder to barium titanate particles each including manganese at 0.04% by mass or more and 0.20% by mass or less in terms of a metal; and sintering a mixture prepared by adding titanium oxide particles each having an average particle diameter of 100 nm or less to the granulating powder.

The barium titanate particles each including manganese may include other property-regulating components and impurities due to synthesis as well as barium titanate and manganese. Examples of the impurities include components derived from metals such as aluminum, calcium, niobium, iron, and lead, glass components, and hydrocarbon-based organic components. The content of the impurities is preferably 5% by mass or less, more preferably 1% by mass or less.

The average particle diameter of the barium titanate particles each including manganese as primary particles is not particularly limited. However, in order to obtain a high-density homogeneous piezoelectric ceramics, it is desired that the average particle diameter of the primary particles be 5 nm or more and 300 nm or less, preferably 50 nm or more and 150 nm or less. The density of the ceramics after sintering may become insufficient when the average particle diameter of the primary particles is too small or too large. Here, the term "primary particle" refers to the minimum unit of a substance which can be clearly distinguished from others among particles constructing powder. The primary particles may aggregate to form larger secondary particles. The secondary particles may be intentionally formed by a granulation step using a polymeric binder.

A manufacturing method for the barium titanate particles each including manganese and a manufacturing method for granulating powder including adding a binder to the barium titanate particles each including manganese are not particularly limited.

In the case of manganese-attached barium titanate, the attaching may be performed by adding a manganese component to commercially available or synthesized barium titanate particles in a downstream step. An addition method for the manganese component is not limited. However, it is desired that the manganese component be uniformly attached to the surface of barium titanate. In the viewpoint, the most preferred addition method is a spray-drying method. The spray-drying method is also preferred from the viewpoints that the method allows producing granulating powder by adding a binder concomitantly with the attaching of the manganese component and that the method allows making the particle diameter more uniform.

In the case of barium titanate in which manganese is dissolved as a solid solution, a barium titanate precursor in which a manganese component is previously incorporated may be crystallized. For example, an equimolar mixture of a barium compound and a titanium compound is prepared, and a desired amount of a manganese component is then added to the mixture. Subsequently, the mixture is calcined at about 1,000° C. to obtain barium titanate particles in each of which the manganese component is dissolved as a solid solution. Also in this case, a manufacturing method for the granulating powder is not particularly limited. However, a spray-drying method is preferred from the viewpoint that the method allows making the particle diameter more uniform.

Examples of the binder which may be used in granulation include polyvinyl alcohol (PVA), polyvinyl butyral (PVB), and an acrylic resin. The amount of the binder added is preferably 1% by mass to 10% by mass, more preferably 2% by mass to 5% by mass from the viewpoint of an increase in density of a molded article.

Examples of the barium compound which may be used in the production of the barium titanate particles each including manganese include barium carbonate, barium oxalate, barium oxide, barium acetate, barium nitrate, barium aluminate, and various barium alkoxides.

Examples of the titanium compound which may be used for the barium titanate particles each including manganese include titanium oxide.

Examples of the manganese component which may be used for the barium titanate particles each including manganese include manganese compounds such as manganese oxide, manganese dioxide, manganese acetate, and manganese carbonate.

The above-mentioned manufacturing method includes sintering a mixture prepared by adding the titanium oxide particles to the granulating powder. In other words, the mixture is in a state in which the abundance of titanium is larger than that of barium. However, as a main component obtained by sintering the mixture is barium titanate (Ba:Ti=1:1), the titanium in excess is precipitated as $Ba_4Ti_{12}O_{27}$ particles or $Ba_6Ti_{17}O_{40}$ particles, in which the abundance of Ti is larger than that of Ba, in the grain boundary. Here, the average particle diameter of the titanium oxide particles is 100 nm or less. The titanium oxide particles each have an average particle diameter of 100 nm or less, and hence show excellent dispersibility with the mixture B and are mixed more uniformly. By the above-mentioned mechanism, such piezoelectric ceramics is capable of keeping Mn in the crystal particles to satisfy both the piezoelectric performance and the mechanical quality factor. The addition amount of the titanium oxide particles is preferably 0.02% by mass or more and 1.5% by mass or less. In other words, the manufacturing method allows the $Ba_4Ti_{12}O_{27}$ particles or the $Ba_6Ti_{17}O_{40}$ particles to be precipitated in the grain boundary in a relatively simple manner.

Hereinafter, a piezoelectric element using the piezoelectric ceramics of the present invention is described.

The piezoelectric element according to the present invention is a piezoelectric element including at least a first electrode, a piezoelectric ceramics, and a second electrode, and the piezoelectric ceramics is the above-mentioned piezoelectric ceramics.

The first electrode and the second electrode are each formed of a conductive layer having a thickness of about 5 nm to 2,000 nm. The material for the conductive layer is not particularly limited, and may be a material which is typically used in a piezoelectric element. Examples of such material include metals such as Ti, Pt, Ta, Ir, Sr, In, Sn, Au, Al, Fe, Cr, Ni, Pd, Ag, and Cu, and oxides of these metals. Each of the first electrode and the second electrode may be formed of one kind of those materials, or may be obtained by laminating two or more kinds thereof. The first electrode and the second electrode may be formed of different materials, respectively.

A manufacturing method for the first electrode and the second electrode is not limited. The first electrode and the second electrode may be formed by baking a metal paste or by sputtering, vapor deposition, or the like. In addition, both the first electrode and the second electrode may be patterned in desired shapes for use.

Figure 1A:
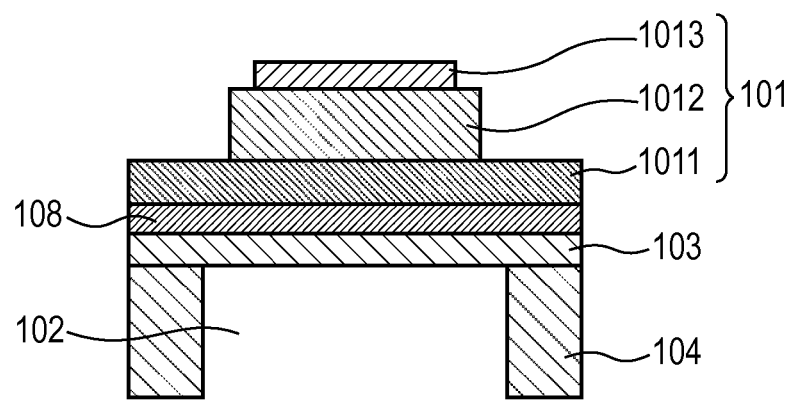
FIG. 1A is a schematic diagram illustrating an embodiment of the construction of a liquid discharge head of the present invention.
Figure 1B:
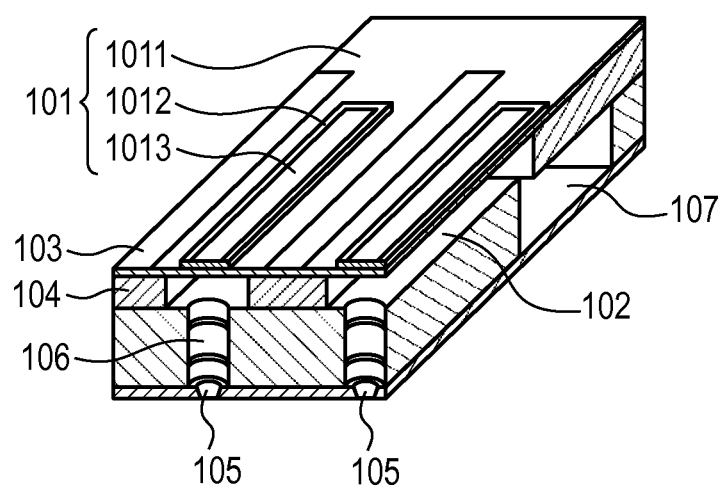
FIG. 1B is a schematic diagram illustrating an embodiment of the construction of the liquid discharge head of the present invention.

FIGS. 1A and 1B are each a schematic view illustrating an embodiment of the construction of a liquid discharge head of the present invention. As illustrated in FIGS. 1A and 1B, the liquid discharge head of the present invention is a liquid discharge head including a piezoelectric element 101 of the present invention. The piezoelectric element 101 is a piezoelectric element including at least a first electrode 1011, a piezoelectric ceramics 1012, and a second electrode 1013. The piezoelectric ceramics 1012 is patterned as required as illustrated in FIG. 1B.

FIG. 1B is a schematic view of the liquid discharge head. The liquid discharge head includes discharge ports 105, individual liquid chambers 102, communicating holes 106 for connecting the individual liquid chambers 102 and the discharge ports 105, liquid chamber partition walls 104, a common liquid chamber 107, a diaphragm 103, and the piezoelectric elements 101. Each of the piezoelectric elements 101, which is of a rectangular shape in the figure, may be of a shape except the rectangular shape such as an elliptical shape, a circular shape, or a parallelogram shape. In general, the piezoelectric ceramics 1012 are each of a shape in conformity with the shape of the individual liquid chamber 102.

The vicinity of the piezoelectric element 101 in the liquid discharge head of the present invention is described in detail with reference to FIG. 1A. FIG. 1A is a sectional view of the piezoelectric element in the width direction of the liquid discharge head illustrated in FIG. 1B. The sectional shape of the piezoelectric element 101, which is illustrated in a rectangular shape, may be a trapezoidal shape or a reverse trapezoidal shape.

In the figure, the first electrode 1011 is used as the lower electrode, and the second electrode 1013 is used as the upper electrode. However, the arrangement of the first electrode 1011 and the second electrode 1013 is not limited to the foregoing. For example, the first electrode 1011 may be used as the lower electrode, or may be used as the upper electrode. Similarly, the second electrode 1013 may be used as the upper electrode, or may be used as the lower electrode. In addition, a buffer layer 108 may be present between the diaphragm 103 and the lower electrode.

Note that, those differences in name are caused by a manufacturing method for the device and an effect of the present invention can be obtained in any case.

In the liquid discharge head, the diaphragm 103 vertically fluctuates owing to the expansion and contraction of the piezoelectric ceramics 1012 to apply a pressure to liquid in the individual liquid chamber 102. As a result, the liquid is discharged from the discharge port 105. The liquid discharge head of the present invention can be used in a printer application or the manufacture of an electronic device.

The diaphragm 103 has a thickness of 1.0 µm or more and 15 µm or less, preferably 1.5 µm or more and 8 µm or less. A material for the diaphragm, which is not limited, is preferably Si. Si for the diaphragm may be doped with B or P. In addition, the buffer layer and the electrode layer on the diaphragm may serve as part of the diaphragm.

The buffer layer 108 has a thickness of 5 nm or more and 300 nm or less, preferably 10 nm or more and 200 nm or less.

The size of the discharge port 105 is 5 µm or more and 40 µm or less in terms of a circle-equivalent diameter. The shape of the discharge port 105 may be a circular shape, or may be a star shape, a square shape, or a triangular shape.

Next, an ultrasonic motor using the piezoelectric element of the present invention is described.

Figure 2A:
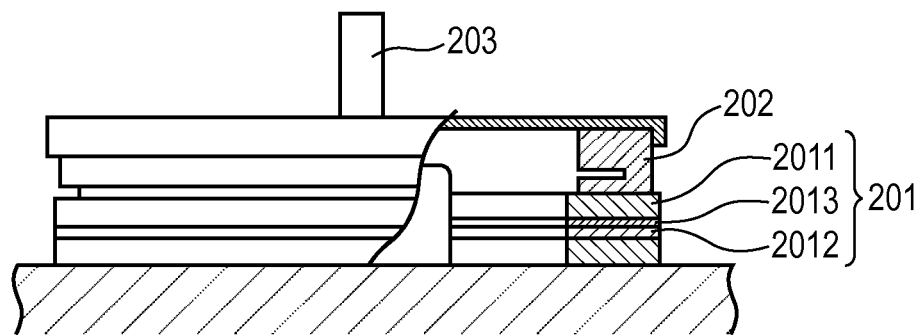
FIG. 2A is a schematic diagram illustrating an embodiment of the construction of an ultrasonic motor of the present invention.
Figure 2B:
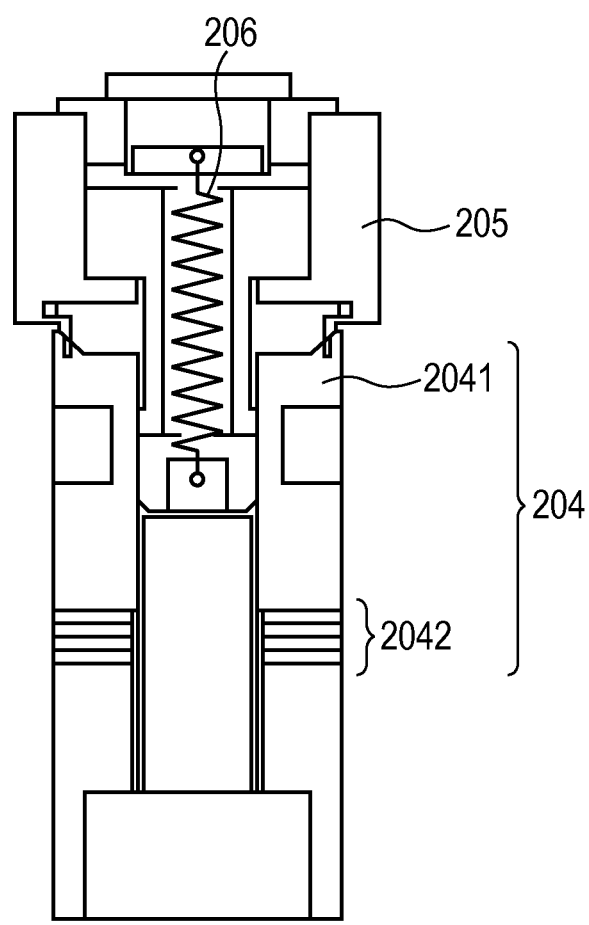
FIG. 2B is a schematic diagram illustrating an embodiment of the construction of the ultrasonic motor of the present invention.

FIGS. 2A and 2B are schematic views illustrating an embodiment of the construction of the ultrasonic motor of the present invention.

FIG. 2A illustrates an ultrasonic motor in which the piezoelectric element of the present invention is formed of a single plate. The ultrasonic motor includes a vibrator 201, a rotor 202 brought into contact with the sliding surface of the vibrator 201 by virtue of a pressure applied from a pressurizing spring (not shown), and an output axis 203 provided so as to be integral with the rotor 202. The vibrator 201 is formed of a metal elastic ring 2011, a piezoelectric element 2012 of the present invention, and an organic adhesive 2013 for bonding the piezoelectric element 2012 to the elastic ring 2011 (such as an epoxy- or cyanoacrylate-based adhesive). The piezoelectric element 2012 of the present invention is formed of a piezoelectric ceramics interposed between a first electrode (not shown) and a second electrode (not shown).

The application of two alternating voltages different from each other in phase by $\pi/2$ to the piezoelectric element of the present invention results in the generation of a bending travelling wave in the vibrator 201, and hence each point on the sliding surface of the vibrator 201 undergoes an elliptical motion. When the rotor 202 is brought into pressure contact with the sliding surface of the vibrator 201, the rotor 202 receives a frictional force from the vibrator 201 to rotate in the direction opposite to the bending travelling wave. A body to be driven (not shown) is joined to the output axis 203, and is driven by the rotary force of the rotor 202.

The application of a voltage to the piezoelectric ceramics results in the expansion and contraction of the piezoelectric ceramics due to a piezoelectric transverse effect. When an elastic body such as a metal is joined to the piezoelectric element, the elastic body is bent by the expansion and contraction of the piezoelectric ceramics. The ultrasonic motor of the kind described here utilizes the principle.

Next, an ultrasonic motor including a piezoelectric element having a laminated structure is illustrated in FIG. 2B. A vibrator 204 is formed of a laminated piezoelectric element 2042 interposed between tubular metal elastic bodies 2041. The laminated piezoelectric element 2042 is an element formed of multiple laminated piezoelectric ceramics (not shown), and includes a first electrode and a second electrode on its outer surface of lamination, and inner electrodes on its inner surface of lamination. The metal elastic bodies 2041 are fastened with bolts so that the piezoelectric element 2042 may be interposed between and fixed by the bodies. Thus, the vibrator 204 is formed.

The application of alternating voltages different from each other in phase to the piezoelectric element 2042 causes the vibrator 204 to excite two vibrations orthogonal to each other. The two vibrations are synthesized to form a circular vibration for driving the tip portion of the vibrator 204. Note that, a constricted circumferential groove is formed in the upper portion of the vibrator 204 to enlarge the displacement of the vibration for driving.

A rotor 205 is brought into contact with the vibrator 204 under a pressure from a spring 206 for pressurization to obtain a frictional force for driving. The rotor 205 is rotatably supported by a bearing.

Next, a dust removal device using the piezoelectric element of the present invention is described.

Figure 3A:
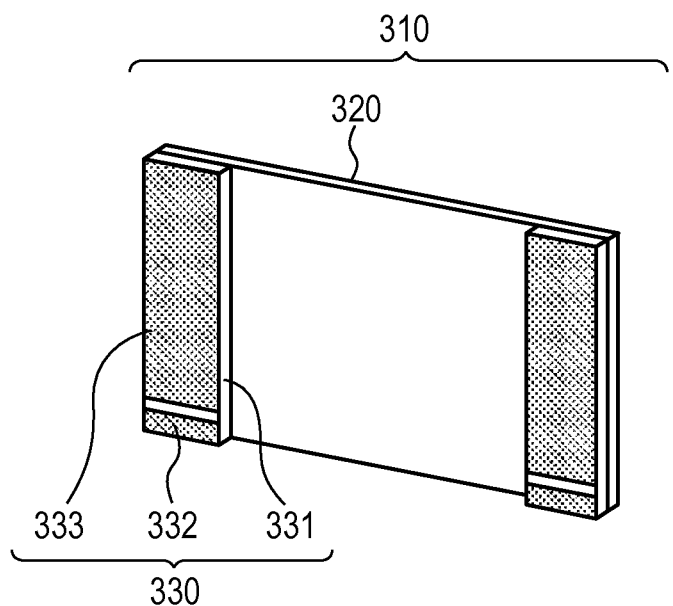
FIG. 3A is a schematic diagram illustrating an embodiment of a dust removal device of the present invention.
Figure 3B:
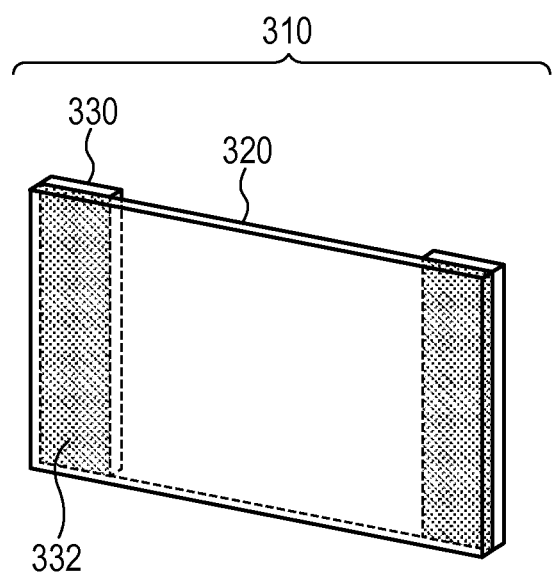
FIG. 3B is a schematic diagram illustrating an embodiment of the dust removal device of the present invention.

FIGS. 3A and 3B are schematic diagrams illustrating an embodiment of the dust removal device of the present invention.

A dust removal device 310 includes a plate-like piezoelectric element 330 and a vibration plate 320. The material of the vibration plate 320 is not limited. In the case where the dust removal device 310 is used for an optical device, a transparent material or a light reflective material can be used as the material of the vibration plate 320.

FIGS. 4A to 4C are schematic diagrams illustrating a construction of the piezoelectric element 330 illustrated in FIGS. 3A and 3B. FIGS. 4A and 4C illustrate a front surface construction and a rear surface construction of the piezoelectric element 330, respectively. FIG. 4B illustrates a side surface construction. As illustrated in FIGS. 4A to 4C, the piezoelectric element 330 includes piezoelectric ceramics 331, a first electrode 332, and a second electrode 333. The first electrode 332 and the second electrode 333 are disposed so as to be opposed to the plate surfaces of the piezoelectric ceramics 331. In FIG. 4C, the front surface of the piezoelectric element 330 on which the first electrode 332 is disposed is referred to as a first electrode surface 336. In FIG. 4A, the front surface of the piezoelectric element 330 on which the second electrode 333 is disposed is referred to as a second electrode surface 337.

Here, the electrode surface in the present invention means a surface of the piezoelectric element on which the electrode is disposed. For instance, as illustrated in FIGS. 4A to 4C, the first electrode 332 may extend around to the second electrode surface 337.

As illustrated in FIGS. 3A and 3B, as for the piezoelectric element 330 and the vibration plate 320, the plate surface of the vibration plate 320 is fixed to the first electrode surface 336 of the piezoelectric element 330. When the piezoelectric element 330 is driven, a stress is generated between the piezoelectric element 330 and the vibration plate 320, so that out-of-plane vibration is generated in the vibration plate. The dust removal device 310 of the present invention is a device that removes foreign matters such as dust adhering to the surface of the vibration plate 320 by the out-of-plane vibration of the vibration plate 320. The out-of-plane vibration means elastic vibration in which the vibration plate moves in the optical axis direction, namely in the thickness direction of the vibration plate.

FIG. 5 is schematic diagram illustrating a vibration principle of the dust removal device 310 of the present invention. FIG. 5 above illustrates a state in which alternating electric fields having the same phase are applied to a pair of left and right piezoelectric elements 330 so that the out-of-plane vibration is generated in the vibration plate 320. The polarization direction of the piezoelectric ceramics forming the pair of left and right piezoelectric elements 330 is the same as the thickness direction of the piezoelectric elements 330, and the dust removal device 310 is driven by the seventh vibrational mode. FIG. 5 below illustrates a state in which alternating voltages having opposite phases by 180 degrees are applied to the pair of left and right piezoelectric elements 330 so that the out-of-plane vibration is generated in the vibration plate 320. The dust removal device 310 is driven by the sixth vibrational mode. The dust removal device 310 of the present invention is a device that can effectively remove dust adhering to the surface of the vibration plate by using at least two vibrational modes selectively.

As described above, the piezoelectric element of the present invention is suitably applicable to the liquid discharge head, the ultrasonic motor, and the dust removal device.

By using the lead-free piezoelectric ceramics containing at least one compound selected from $Ba_4Ti_{12}O_{27}$ and $Ba_6Ti_{17}O_{40}$ of the present invention, it is possible to provide the liquid discharge head having the same or higher nozzle density and discharge force than the case where the piezoelectric ceramics containing lead is used.

By using the lead-free piezoelectric ceramics containing at least one compound selected from $Ba_4Ti_{12}O_{27}$ and $Ba_6Ti_{17}O_{40}$ of the present invention, it is possible to provide the ultrasonic motor having the same or higher driving force and durability than the case where the piezoelectric ceramics containing lead is used.

By using the lead-free piezoelectric ceramics containing at least one compound selected from $Ba_4Ti_{12}O_{27}$ and $Ba_6Ti_{17}O_{40}$ of the present invention, it is possible to provide the dust removal device having the same or higher dust-removing efficiency than the case where the piezoelectric ceramics containing lead is used.

The piezoelectric ceramics of the present invention can be used in devices such as an ultrasonic vibrator, a piezoelectric actuator, a piezoelectric sensor, a ferroelectric memory, and the like in addition to the liquid discharge head and the motor.

As described above, the piezoelectric element of the present invention is suitably used in the liquid discharge head and the ultrasonic motor. The liquid discharge head includes a lead-free piezoelectric element containing barium titanate as a principle component. Thus, the head can be provided as one having the same or higher nozzle density and discharge force than those of a lead-based piezoelectric element. In addition, the ultrasonic motor may include a lead-free piezoelectric element containing barium titanium as a principle component. Thus, the motor can be provided as one having the same or higher driving force and durability than those of the lead-based piezoelectric element.

The piezoelectric ceramics of the present invention can be used in devices such as an ultrasonic vibrator, a piezoelectric actuator, and a piezoelectric sensor, and the like in addition to the liquid discharge head and the motor.

EXAMPLES

Hereinafter, the present invention is described more specifically by way of examples. However, the present invention is not limited by the following examples.

Example 1 (Manufacturing Method 1 for Ceramics)

Barium carbonate, titanium oxide, and manganese oxide were used as raw materials, and weighted to give a 1:1 mole ratio of Ba to Ti while giving 0.12% by mass of manganese added with respect to the total mass of barium oxide and titanium oxide in terms of metals. Then, these raw materials were mixed. The resulting mixed powder was calcined at 900° C. to 1,100° C. for 2 to 5 hours.

Subsequently, 3% by mass of PVA as a binder was added to the calcined powder and the resulting mixture was spray-dried to give granulating powder. Then, 0.9% by mass of $Ba_4Ti_{12}O_{27}$ was added to and mixed with the granulating powder.

Next, the obtained powder was filled in a die and then compressed to form a compact. The resulting compact was sintered at 1,300° C. to 1,400° C. for 2 to 6 hours to obtain a ceramics. Here, a heat-up rate was set to 10° C./minute and the thermocouple of an electric furnace was adjusted so as to prevent an overshoot of 10° C. or more from a sintering temperature.

The resulting sintered body was ground to a thickness of 1 mm. After that, the sintered body was subjected to heat treatment in the air at 450° C. to 1,100° C. for 1 to 3 hours to remove organic components from the surface of the sintered body.

Example 2 (Manufacturing Method 2 For Ceramics)

Barium carbonate, titanium oxide, and manganese oxide were used as raw materials, and weighted to give a 1:1 mole ratio of Ba to Ti while giving 0.12% by mass of manganese added with respect to the total mass of barium oxide and titanium oxide in terms of metals. Then, these raw materials were mixed. The resulting mixed powder was calcined at 900° C. to 1,100° C. for 2 to 5 hours.

Subsequently, 3% by mass of PVA as a binder was added to the calcined powder and the resulting mixture was spray-dried to give granulating powder. Then, 0.85% by mass of $Ba_6Ti_{17}O_{40}$ was added to and mixed with the granulating powder.

Next, the obtained powder was filled in a die and then compressed to form a compact. The resulting compact was sintered at 1,300° C. to 1,400° C. for 2 to 6 hours to obtain a ceramics. Here, a heat-up rate was set to 10° C./minute and the thermocouple of an electric furnace was adjusted so as to prevent an overshoot of 10° C. or more from a sintering temperature.

The resulting sintered body was ground to a thickness of 1 mm. After that, the sintered body was subjected to heat treatment in the air at 450° C. to 1,100° C. for 1 to 3 hours to remove organic components from the surface of the sintered body.

Example 3 (Manufacturing Method 3 for Ceramics)

Barium carbonate, titanium oxide, and manganese oxide were used as raw materials, and weighted to give a 1:1 mole ratio of Ba to Ti while giving 0.12% by mass of manganese added with respect to the total mass of barium oxide and titanium oxide in terms of metals. Then, these raw materials were mixed. The resulting mixed powder was calcined at 900° C. to 1,100° C. for 2 to 5 hours.

Subsequently, 3% by mass of PVA as a binder was added to the calcined powder and the resulting mixture was spray-dried to give granulating powder. Then, 0.45% by mass each of $Ba_4Ti_{12}O_{27}$ and $Ba_6Ti_{17}O_{40}$ was added to and mixed with the granulating powder.

Next, the obtained powder was filled in a die and then compressed to form a compact. The resulting compact was sintered at 1,300° C. to 1,400° C. for 2 to 6 hours to obtain a ceramics. A heat-up rate was set to 10° C./minute and the thermocouple of an electric furnace was adjusted so as to prevent an overshoot of 10° C. or more from a sintering temperature.

The resulting sintered body was ground to a thickness of 1 mm. The sintered body was subjected to heat treatment in the air at 450° C. to 1,100° C. for 1 to 3 hours to remove organic components from the surface of the sintered body.

Example 4 to Example 10 (Manufacturing Method 4 for Ceramics)

Barium carbonate, titanium oxide, and manganese oxide were used as raw materials, and weighted to give a 1:1 mole ratio of Ba to Ti while giving an amount of manganese added as shown in Table 1. Then, these raw materials were mixed. The resulting mixed powder was calcined at 900° C. to 1,100° C. for 2 to 5 hours.

Subsequently, 3% by mass of PVA as a binder was added to the calcined powder and the resulting mixture was spray-dried to give granulating powder. Then, the granulating powder was mixed with titanium oxide ($TiO_2$) of 10 nm to 30 nm in average particle diameter and the resulting powder was filled in a die, followed by compression to form a compact.

Next, the resulting compact was sintered at 1,300° C. to 1,450° C. for 2 to 6 hours to obtain a ceramics. A heat-up rate was set to 10° C./minute and the thermocouple of an electric furnace was adjusted so as to prevent an overshoot of 10° C. or more from a sintering temperature.

The resulting sintered body was ground to a thickness of 1 mm. The sintered body was subjected to heat treatment in the air at 450° C. to 1,100° C. for 1 to 3 hours to remove organic components from the surface of the sintered body.

Comparative Example 1 (Manufacturing Method 5 for Ceramics)

Barium carbonate, titanium oxide, and manganese oxide were used as raw materials, and weighted to give a 1:1 mole ratio of Ba to Ti while giving 0.12% by mass of manganese added with respect to the total mass of barium oxide and titanium oxide in terms of metals. Then, these raw materials were mixed. The resulting mixed powder was calcined at 900° C. to 1,100° C. for 2 to 5 hours.

Subsequently, 3% by mass of PVA as a binder was added to the calcined powder and the resulting mixture was spray-dried to give granulating powder. The granulating powder was filled in a die, followed by compression to form a compact.

The resulting compact was sintered at 1,300° C. to 1,400° C. for 2 to 6 hours to obtain a ceramics. A heat-up rate was set to 10° C./minute and the thermocouple of an electric furnace was adjusted so as to prevent an overshoot of 10° C. or more from a sintering temperature.

The resulting sintered body was ground to a thickness of 1 mm. The sintered body was subjected to heat treatment in the air at 450° C. to 1,100° C. for 1 to 3 hours to remove organic components from the surface of the sintered body.

Table 1 shows manufacturing conditions of the piezoelectric ceramics of Examples 1 to 10. In the table, the item "Mn amount" represents the weighed amount of manganese.

micro analyzer (referred to as EPMA). In addition, the crystal particle diameter was evaluated using a scanning electron microscope.

Further, the composition of the whole piezoelectric ceramics was evaluated by X-ray fluorescence analysis (XRF).

The piezoelectric ceramics was evaluated for grain boundary parts. Specifically, the percentage of the grain boundary parts in the piezoelectric ceramics, the crystal structure in the grain boundary, the presence or absence of Mn in the crystals, and the amount of Mn in the grain boundary were determined.

A procedure for preparing a sample for observation of piezoelectric ceramics using a transmission electron microscope is described. First, a metal or carbon film was laminated on the surface of the piezoelectric ceramics which was polished to a mirror-finished surface. Such coating was provided for preventing electric charges from being accumulated on the surface of the piezoelectric ceramics during the process for manufacturing a TEM thin sample. Then, a thin sample of approximately 1 µm in thickness by 10 µm in width by 5 µm in length was cut out from the surface of the piezoelectric ceramics using a focused ion beam. The sample was attached to a grid for TEM observation. The sample was irradiated with a focused ion beam in parallel with the longitudinal direction of the sample so that the sample had a thickness of about 100 nm over an area of approximately 5 µm in length. The transmission electron microscope observation was carried out by irradiating the sample (1 µm in thickness by 10 µm in width by 5 µm in length) with an electron beam from the thickness direction thereof.

An electron diffraction image of the grain boundary was acquired using the selected-area diffraction method. Simultaneously, a known barium titanate crystal particle part ($BaTiO_3$) was observed under the same conditions to define a camera constant. Lattice spacing was calculated from the resulting diffraction image of the grain boundary part. The electronic diffraction image observation was carried out while the inclination angle of the sample was arbitrarily changed to give several different diffraction images from the same point of the grain boundary. The lattice spacing of each diffraction image was calculated and compared with the known literature data to specify the crystal structure of the grain boundary. The composition of the grain boundary part was analyzed by the STEM-EDX method to calculate the

TABLE 1

Manufacturing conditions of piezoelectric ceramics

| | Manufacturing method | Mn amount (% by mass) | Additive | Additive amount (% by mass) | Sintering temperature (° C.) |
|---|---|---|---|---|---|
| Example 1 | 1 | 0.12 | $Ba_4Ti_{12}O_{27}$ | 0.9 | 1,380 |
| Example 2 | 2 | 0.12 | $Ba_6Ti_{17}O_{40}$ | 0.85 | 1,380 |
| Example 3 | 3 | 0.12 | $Ba_4Ti_{12}O_{27}$ $Ba_6Ti_{17}O_{40}$ | 0.9 | 1,380 |
| Example 4 | 4 | 0.04 | $TiO_2$ | 1 | 1,380 |
| Example 5 | 4 | 0.12 | $TiO_2$ | 0.9 | 1,380 |
| Example 6 | 4 | 0.2 | $TiO_2$ | 0.4 | 1,380 |
| Example 7 | 4 | 0.12 | $TiO_2$ | 0.05 | 1,300 |
| Example 8 | 4 | 0.12 | $TiO_2$ | 0.4 | 1,330 |
| Example 9 | 4 | 0.12 | $TiO_2$ | 1 | 1,420 |
| Example 10 | 4 | 0.12 | $TiO_2$ | 2 | 1,400 |
| Comparative Example 1 | 5 | 0.12 | None | 0 | 1,380 |

(Structural Evaluation of Piezoelectric Ceramics)

The structures of crystal particles and grain boundary of the obtained piezoelectric ceramics were evaluated using a transmission electron microscope (TEM).

First, the crystal structure of crystal particles in each piezoelectric ceramics was evaluated using an electron diffraction image. In Examples 1 to 10 and Comparative Example 1, the crystal particles were each formed of $BaTiO_3$ having an Mn-containing perovskite structure. The Mn in the crystal particles was determined using an electron probe concentration of Mn in the grain boundary part. The "STEM-EDX" is a technique for measuring, by energy dispersive X-ray spectroscopy (EDX), the intensity of X-ray fluorescence at any place on a same image observed by scan transmission electron microscopy (STEM).

Physical properties of crystal particles and grain boundaries of the obtained piezoelectric ceramics are listed in Table 2.

(Evaluation of Content of Physical Properties of Grain Boundary)
- A: Only $Ba_4Ti_{12}O_{27}$ was contained.
- B: Only $Ba_6Ti_{17}O_{40}$ was contained.
- C: $Ba_4Ti_{12}O_{27}$ and $Ba_6Ti_{17}O_{40}$ were contained.
- x: None of the crystal structures of $Ba_4Ti_{12}O_{27}$ and $Ba_6Ti_{17}O_{40}$ was confirmed.

(Evaluation of Presence or Absence of Mn of Physical Properties of Grain Boundary)
- o: Mn was present in the crystals contained in the grain boundary.
- x: Mn was not present in the crystals contained in the grain boundary.

Further, the results of the composition analysis by the XRF (but omitted in the table) revealed that a mole ratio of Ba to Ti was 1.0:1.0 in each of Examples 1 to 10 and Comparative Example 1.

the measurement, the areas were calculated for every set of 10 photographed SEM images. The above-mentioned analysis was performed on an area which was considered to be sufficiently large for distribution of the sub-particles in the piezoelectric ceramics. By comparing the total of the areas of the sub-particles and the total of the areas of the crystal particles obtained by the above-mentioned analysis, the content rate (% by area) of the sub-particles to the piezoelectric ceramics was calculated.

Figure 8A:
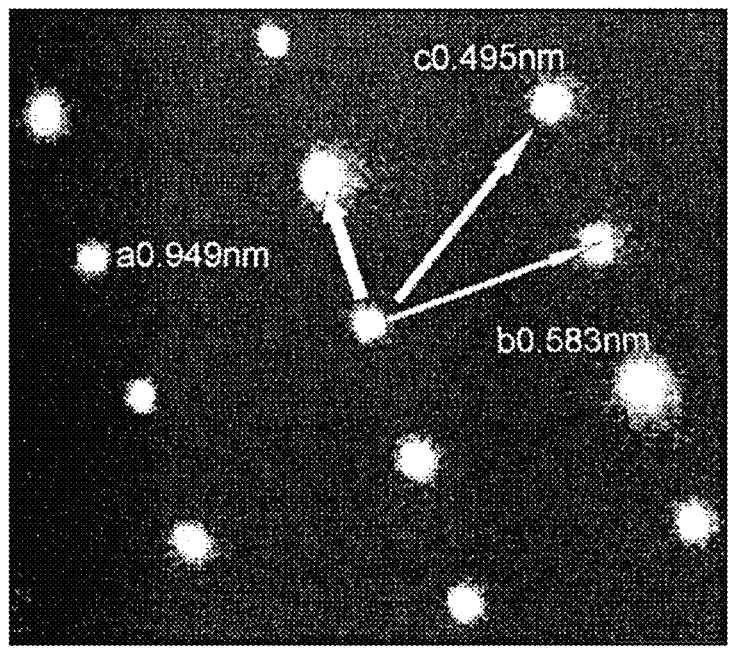
FIG. 8A is a [100] incident electron diffraction pattern of $Ba_4Ti_{12}O_{27}$ calculated from literature data.
Figure 8B:
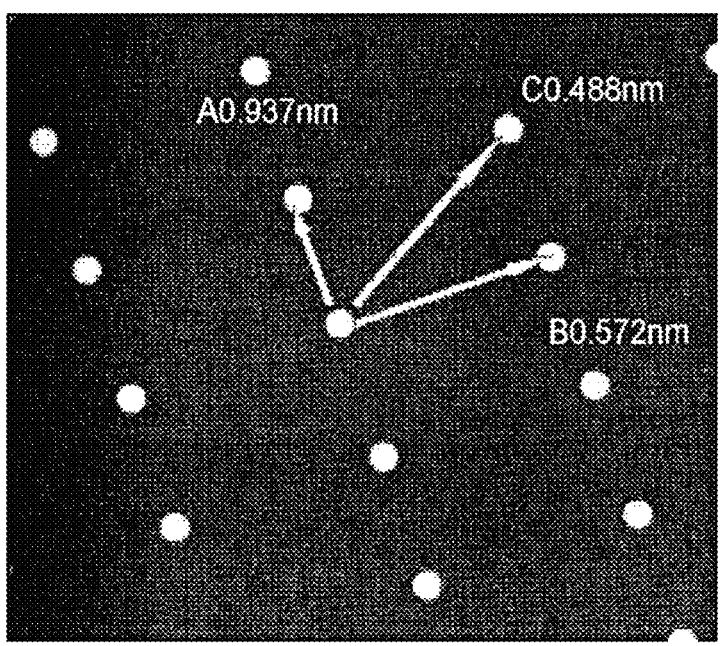
FIG. 8B is an electron diffraction image of a non-perovskite-type structure in the grain boundary of a piezoelectric ceramics of the present invention.

FIG. 8B is an electron diffraction image of Example 5 obtained by the TEM selected-area diffraction method. FIG. 8A shows a [100] incident electron diffraction pattern of $Ba_4Ti_{12}O_{27}$ calculated from literature data. By comparing their lattice spacings, it was confirmed that the sub-particles contained $Ba_4Ti_{12}O_{27}$. Similarly, it was also confirmed in each of Examples 1, 3, 4, and 6 to 10.

Table 3 shows results of the comparison between the lattice spacing obtained from the above-mentioned electron diffraction image observed using the selected-area diffraction method and the lattice spacing obtained from the known literature data of $Ba_4Ti_{12}O_{27}$. As is evident from the following table, $Ba_4Ti_{12}O_{27}$ is present in the piezoelectric ceramics of the present invention.

TABLE 2

Physical properties of crystal particles and grain boundary

| | Physical properties of crystal particles | | Physical properties of grain boundary | | | |
|---|---|---|---|---|---|---|
| | Particle diameter (μm) | Mn amount (% by mass) | Grain boundary ratio (% by area) | Content | Presence or absence of Mn | Mn amount (% by mass) |
| Example 1 | 110 | 0.12 | 0.9 | A | o | 1.2 |
| Example 2 | 90 | 0.12 | 0.85 | B | o | 1.7 |
| Example 3 | 100 | 0.12 | 0.9 | C | o | 1.3 |
| Example 4 | 150 | 0.04 | 1 | C | x | 0.4 |
| Example 5 | 100 | 0.12 | 0.9 | C | o | 1.5 |
| Example 6 | 50 | 0.2 | 0.4 | C | o | 3 |
| Example 7 | 10 | 0.12 | 0.05 | C | o | 1.2 |
| Example 8 | 50 | 0.12 | 0.4 | C | o | 1.2 |
| Example 9 | 150 | 0.12 | 1 | C | o | 1.3 |
| Example 10 | 200 | 0.12 | 2 | C | o | 1.2 |
| Comparative Example 1 | 100 | 0.1 | 0.9 | x | x | 1 |

(Grain Boundary Ratio)

A grain boundary ratio represents a percentage (% by area) of at least one compound selected from $Ba_4Ti_{12}O_{27}$ and $Ba_6Ti_{17}O_{40}$ contained in the grain boundary.

As a result of the surface image observation by SEM, it was found that sub-particles were observed with a contrast different from that of the crystal particles. Based on the results of the SEM observation, an analysis using the technique described below was performed to determine a ratio of at least one compound selected from $Ba_4Ti_{12}O_{27}$ and $Ba_6Ti_{17}O_{40}$ contained in the grain boundary to the whole piezoelectric ceramics. In other words, an SEM image of the surface of the piezoelectric ceramics was observed and represented in binary based on a difference in contrast between the crystal particle part and the sub-particle part to measure the area of each of the both parts. For simplifying

TABLE 3

Comparison of spacing ([100] incident electron diffraction image of $Ba_4Ti_{12}O_{27}$)

| Spacing d (nm) | Experimental value | Literature value |
|---|---|---|
| A: (0 0 1) | 0.949 | 0.937 |
| B: (0 2 1) | 0.583 | 0.572 |
| C: (0 2 0) | 0.495 | 0.488 |

Figure 9A:
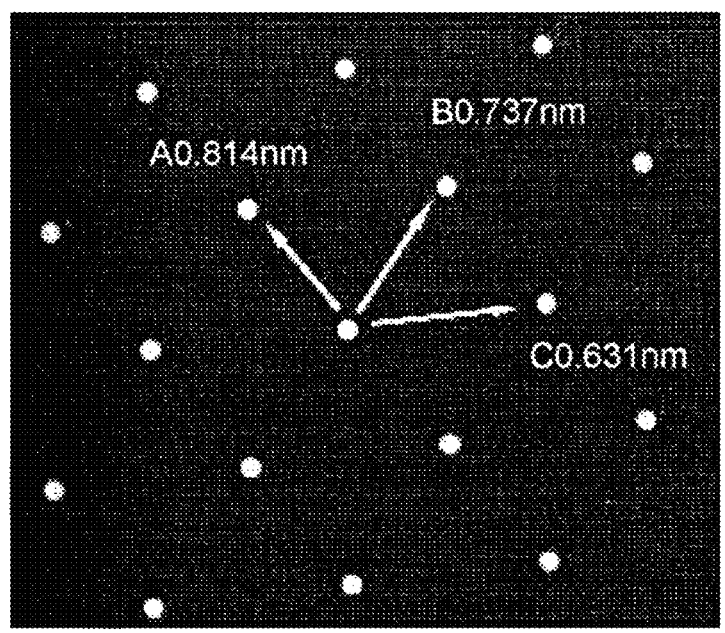
FIG. 9A is a [011] incident electron diffraction pattern of $Ba_6Ti_{17}O_{40}$ calculated from literature data.
Figure 9B:
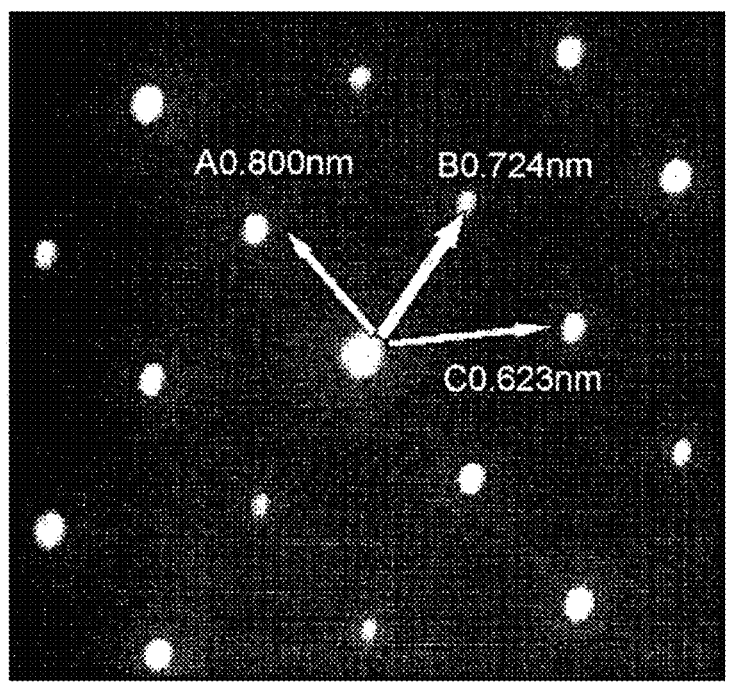
FIG. 9B is an electron diffraction image of the non-perovskite-type structure in the grain boundary of a piezoelectric ceramics of the present invention.

Further, FIG. 9B is an electron diffraction image of the grain boundary part in the piezoelectric ceramics of Example 5 obtained by the TEM selected-area diffraction method. FIG. 9A shows a [011] incident electron diffraction pattern of $Ba_6Ti_{17}O_{40}$ calculated from literature data. By comparing their lattice spacings, it was confirmed that the sub-particles contained $Ba_6Ti_{17}O_{40}$. Similarly, it was also confirmed in each of Examples 2 to 4 and 6 to 10.

Table 4 shows results of the comparison between the lattice spacing obtained from the above-mentioned electron diffraction image observed by the selected-area diffraction method and the lattice spacing obtained from the known literature data of $Ba_6Ti_{17}O_{40}$.

TABLE 4

Comparison of spacing ([011] incident electron diffraction image of $Ba_6Ti_{17}O_{40}$)

| Miller indices | Observed spacing value (nm) | Literature spacing value (nm) |
| --- | --- | --- |
| A: (−1 −1 1) | 0.800 | 0.814 |
| B: (−1 1 −1) | 0.724 | 0.737 |
| C: (0 2 −2) | 0.623 | 0.631 |

In Comparative Example 1, any crystal structure of $Ba_4Ti_{12}O_{27}$ and $Ba_6Ti_{17}O_{40}$ was not found in the grain boundary. Thus, it is found that the amount of Mn in the crystal particles is smaller than the weighed amount of Mn. On the other hand, in Examples 1 to 10, the amount of Mn in the crystal particles was substantially equal to the weighed amount of Mn. This is probably because Mn was efficiently incorporated into crystal particles as a result of including at least one of $Ba_4Ti_{12}O_{27}$ and $Ba_6Ti_{17}O_{40}$ in the grain boundary.

In addition, the amount of Mn in the grain boundary part in each of Examples 1 to 10 was measured. Specifically, grain boundaries were measured at multiple points by combining the crystal structure obtained by the selected-area diffraction method with the energy dispersive spectroscopy. As a result, only in Example 4, Mn was found in none of $Ba_4Ti_{12}O_{27}$ and $Ba_6Ti_{17}O_{40}$. Further, in Examples 3 and 5 to 10, an area where the crystal structure was $Ba_4Ti_{12}O_{27}$ found to contain Mn approximately 1% by mass more than $Ba_6Ti_{17}O_{40}$ in average. Therefore, for example, by adding the $Ba_4Ti_{12}O_{27}$ particles to the granulating powder, the precipitation of manganese out of the crystal particles of the piezoelectric ceramics was able to be effectively prevented by manufacturing the piezoelectric ceramics in which the grain boundaries were occupied by only $Ba_4Ti_{12}O_{27}$.

(Evaluation of Piezoelectric Properties of Ceramics)

Gold electrodes were formed on both the front and back sides of the manufactured piezoelectric ceramics by the DC sputtering method to evaluate the piezoelectric properties of the piezoelectric ceramics. Then, the electrode-mounted ceramics was cut into a rectangle (strip ceramics) of 10 mm by 2.5 mm by 1 mm in size.

The resulting strip ceramics was polarized. The polarization was performed under the conditions of: a polarization voltage of 1 kV DC and a voltage-application time of 30 minutes at a temperature of 100° C.

A piezoelectric constant was determined using the polarized strip ceramics. Specifically, the frequency dependency of impedance of the ceramics sample was determined using an impedance analyzer (trade name: 4294A, manufactured by Agilent Co., Ltd.). Then, the piezoelectric constant $d_{31}$ (pm/V) and the mechanical quality factor $Q_m$ were calculated from the observed resonance frequency and anti-resonance frequency. The piezoelectric constant $d_{31}$ has a negative value, and a larger absolute value thereof means higher piezoelectric performance. In addition, a larger absolute value of the mechanical quality factor $Q_m$ means a smaller loss in resonance vibration of the resonator.

Results of the evaluation of the piezoelectric properties are listed in Table 5.

TABLE 5

| | Piezoelectric properties | |
| --- | --- | --- |
| | Piezoelectric constant $d_{31}$ (pm/V) | Mechanical quality factor $Q_m$ |
| Example 1 | 107 | 1,320 |
| Example 2 | 106 | 1,210 |
| Example 4 | 110 | 520 |
| Example 5 | 118 | 1,290 |
| Example 6 | 106 | 1,840 |
| Example 10 | 114 | 1,260 |
| Comparative Example 1 | 95 | 440 |

As is evident from Table 5, it is found that including at least one of $Ba_4Ti_{12}O_{27}$ and $Ba_6Ti_{17}O_{40}$ in the grain boundary can improve both the piezoelectric constant $d_{31}$ and the mechanical quality factor $Q_m$.

(Liquid Discharge Head According to Example 1)

Using the same piezoelectric ceramics as that of Example 1, a liquid discharge head illustrated in FIGS. 1A and 1B was prepared. Ink discharge from the liquid discharge head in response to input electric signals was confirmed.

(Ultrasonic Motor According to Example 1)

Using the same piezoelectric ceramics as that of Example 1, an ultrasonic motor illustrated in FIGS. 2A and 2B were prepared. The rotary behavior of the motor in response to application of an alternating voltage was confirmed.

(Dust Removal Device According to Example 1)

Using the same piezoelectric ceramics as that of Example 1, a dust removal device illustrated in FIGS. 3A and 3B were prepared. When an alternating voltage was applied after bedashing plastic beads, a satisfactory dust-removing rate was confirmed.

INDUSTRIAL APPLICABILITY

The piezoelectric ceramics of the present invention has both of satisfactory piezoelectric performance and a satisfactory mechanical quality factor. In addition, the piezoelectric ceramics of the present invention is environmentally clean. Thus, the piezoelectric ceramics can be used in a device that utilizes a large amount of piezoelectric ceramics, such as a liquid discharge head, an ultrasonic motor, and a piezoelectric element.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

REFERENCE NUMERALS LIST 101 piezoelectric element
102 individual liquid chamber
103 vibration plate
104 liquid chamber partition wall
105 discharge port
106 communicating hole
107 common liquid chamber
108 buffer layer
1011 first electrode 1012 piezoelectric ceramics
1013 second electrode
201 vibrator
202 rotor
203 output axis
204 vibrator
205 rotor
206 spring
2011 elastic ring
2012 piezoelectric element
2013 organic adhesive
2041 metal elastic body
2042 laminated piezoelectric element
310 dust removal device
330 piezoelectric element
320 vibration plate
331 piezoelectric ceramics
332 first electrode
333 second electrode
336 first electrode surface
337 second electrode surface
401 barium titanate crystal particle
402 boundary between crystal particles
403 triple point
404 sub-particle present on boundary between crystal particles
405 sub-particle present on boundary between crystal particles and at triple point
406 sub-particle present at triple point
501 barium titanate crystal particle
502 sub-particle
503 barium titanate crystal particle
504 sub-particle

The invention claimed is:

1. A manufacturing method for a piezoelectric ceramics, comprising at least:

producing granulating powder by adding a binder to barium titanate particles each comprising manganese at 0.04% by mass or more and 0.20% by mass or less in terms of a metal; and sintering a mixture prepared by adding at least one compound selected from the group consisting of $Ba_4Ti_{12}O_{27}$ particles and $Ba_6Ti_{17}O_{40}$ particles to the granulating powder.

2. A manufacturing method for a piezoelectric ceramics, comprising at least:

producing granulating powder by adding a binder to barium titanate particles each comprising manganese at 0.04% by mass or more and 0.20% by mass or less in terms of a metal; and sintering a mixture prepared by adding titanium oxide particles each having an average particle diameter of 100 nm or less to the granulating powder.

* * * * *